United States Patent
Son et al.

(10) Patent No.: US 9,029,939 B2
(45) Date of Patent: *May 12, 2015

(54) METHOD OF MANUFACTURING A VERTICAL-TYPE SEMICONDUCTOR DEVICE AND METHOD OF OPERATING A VERTICAL-TYPE SEMICONDUCTOR DEVICE

(71) Applicant: Samsung Electronics Co., Ltd., Suwon-si, Gyeonggi-do (KR)

(72) Inventors: Yong-Hoon Son, Yongin-si (KR); Jong-Wook Lee, Yongin-si (KR); Jong-Hyuk Kang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 143 days.

This patent is subject to a terminal disclaimer.

(21) Appl. No.: 13/750,066

(22) Filed: Jan. 25, 2013

(65) Prior Publication Data

US 2013/0134501 A1    May 30, 2013

Related U.S. Application Data

(63) Continuation of application No. 13/102,187, filed on May 6, 2011, now Pat. No. 8,367,491, which is a continuation of application No. 12/478,081, filed on Jun. 4, 2009, now Pat. No. 7,960,780.

(30) Foreign Application Priority Data

Jun. 4, 2008    (KR) .................. 10-2008-0052368

(51) Int. Cl.
  *H01L 29/78* (2006.01)
  *H01L 27/108* (2006.01)
  *H01L 29/66* (2006.01)

(52) U.S. Cl.
  CPC .......... *H01L 29/7827* (2013.01); *H01L 27/108* (2013.01); *H01L 27/10802* (2013.01); *H01L 27/10876* (2013.01); *H01L 29/66666* (2013.01); *H01L 29/7841* (2013.01)

(58) Field of Classification Search
  CPC ..... H01L 29/78; H01L 29/772; H01L 29/792; H01L 21/8242
  See application file for complete search history.

(56) References Cited

U.S. PATENT DOCUMENTS 7,034,336 B2    4/2006    Willer
7,132,355 B2    11/2006   Ramaswamy et al.

(Continued)

OTHER PUBLICATIONS

"Vertical-Type Semiconductor Device" Specification, Drawings and Prosecution History, of U.S. Appl. No. 12/478,081, filed Jun. 4, 2009, by Yong-Hoon Son, et al.

(Continued)

*Primary Examiner* — Minh-Loan T Tran
*Assistant Examiner* — Fazli Erdem
(74) *Attorney, Agent, or Firm* — Onello & Mello, LLP

(57) ABSTRACT

In a vertical-type semiconductor device, a method of manufacturing the same and a method of operating the same, the vertical-type semiconductor device includes a single-crystalline semiconductor pattern having a pillar shape provided on a substrate, a gate surrounding sidewalls of the single-crystalline semiconductor pattern and having an upper surface lower than an upper surface of the single-crystalline semiconductor pattern, a mask pattern formed on the upper surface of the gate, the mask pattern having an upper surface coplanar with the upper surface of the single-crystalline semiconductor pattern, a first impurity region in the substrate under the single-crystalline semiconductor pattern, and a second impurity region under the upper surface of the single-crystalline semiconductor pattern. The vertical-type pillar transistor formed in the single-crystalline semiconductor pattern may provide excellent electrical properties. The mask pattern is not provided on the upper surface of the single-crystalline semiconductor pattern in the second impurity region, to thereby reduce failures of processes.

16 Claims, 22 Drawing Sheets

(56) References Cited

U.S. PATENT DOCUMENTS

| | | | |
|---|---|---|---|
| 7,256,109 B2 | 8/2007 | Moriguchi et al. | |
| 7,462,899 B2* | 12/2008 | Seo et al. | 257/296 |
| 7,960,780 B2* | 6/2011 | Son et al. | 257/329 |
| 2004/0115884 A1* | 6/2004 | Wang | 438/257 |
| 2006/0097314 A1* | 5/2006 | Uchiyama | 257/330 |
| 2007/0012996 A1* | 1/2007 | Yoon et al. | 257/329 |
| 2009/0302377 A1 | 12/2009 | Son et al. | |
| 2010/0025757 A1* | 2/2010 | Son et al. | 257/329 |
| 2010/0109079 A1* | 5/2010 | Son et al. | 257/329 |
| 2010/0123182 A1* | 5/2010 | Son et al. | 257/324 |
| 2011/0017971 A1* | 1/2011 | Kim et al. | 257/5 |
| 2011/0211399 A1 | 9/2011 | Son et al. | |

OTHER PUBLICATIONS

"Vertical-Type Semiconductor Device" Specification, Drawings and Prosecution History, of U.S. Appl. No. 13/102,187, filed May 6, 2011, by Yong-Hoon Son, et al.

* cited by examiner

METHOD OF MANUFACTURING A VERTICAL-TYPE SEMICONDUCTOR DEVICE AND METHOD OF OPERATING A VERTICAL-TYPE SEMICONDUCTOR DEVICE

RELATED APPLICATIONS

This application is a continuation application of U.S. patent application Ser. No. 13/102,187, filed on May 6, 2011, which is a continuation application of U.S. patent application Ser. No. 12/478,081, filed on Jun. 4, 2009, which claims the benefit of Korean patent application number 10-2008-0052368, filed on Jun. 4, 2008, in the Korean Intellectual Property Office, the contents of which applications are incorporated herein in their entirety by reference.

BACKGROUND

1. Field

Example embodiments relate to a vertical-type semiconductor device, a method of manufacturing the vertical-type semiconductor device and a method of operating the vertical-type semiconductor device. More particularly, example embodiments relate to a semiconductor device having a vertical-type pillar transistor suitable for a cell array structure, a method of manufacturing the semiconductor device and a method of operating the semiconductor device.

2. Description of the Related Art

Generally, as semiconductor devices become highly integrated, dimensions of active regions are reduced, and channel lengths of MOS transistors formed in the active regions are reduced. As the channel length of the MOS transistor is reduced, electric fields or potentials in the channel regions are dramatically affected by a source or drain, and the short channel effects arise. When the short channel effects occur, a leakage current is increased, a threshold voltage is decreased and a current effected by a drain voltage is increased. Accordingly, it becomes difficult to control the MOS transistor by a gate.

Thus, methods of scaling down devices formed on a substrate and improve characteristics of the device has been researched. For example, a vertical-type pillar transistor including in a channel region formed in a vertical direction with respect to a substrate has been researched. That is, in the vertical-type pillar transistor, a semiconductor pattern having a pillar shape on the substrate is used as the channel region. Even though a horizontal area in the substrate is not widened, the height of the semiconductor pattern having a pillar shape may be controllable to be increased to provide a desired channel length.

Since the vertical-type pillar transistor is formed in the semiconductor pattern, not in the bulk substrate, characteristics of the semiconductor pattern may be very important for performances of the transistor. That is, when the semiconductor pattern has any crystal defect, leakage current properties and threshold voltages in the vertical-type pillar transistor formed in each of the semiconductor patterns may not be uniform. However, because it is considerably more difficult than the bulk substrate to form the semiconductor pattern without any crystal defect, it may be not easy to ensure electrical properties of the vertical-type pillar transistors.

Additionally, processes of forming a gate and a source/drain in the pillar-shaped semiconductor pattern are considerably more complicated than those in the substrate. Further, when the vertical-type pillar transistors are formed to have an array structure, more complicated processes need to be additionally performed, such that the incidence of process failures increases. Accordingly, it may be difficult to manufacture a memory device of an array structure including the vertical-type pillar transistors.

Further, in order to manufacture a highly-integrated semiconductor memory device including the vertical-type pillar transistor, a method of reducing dimension of the substrate for each unit cell and providing a sufficient process margin is required.

SUMMARY

Example embodiments provide a semiconductor device including a vertical-type pillar transistor with high performance.

Example embodiments provide a method of manufacturing the semiconductor device.

Example embodiments provide a method of operating the semiconductor device.

According to some example embodiments, a vertical-type semiconductor device includes a single-crystalline semiconductor pattern having a pillar shape provided on a substrate; a gate surrounding sidewalls of the single-crystalline semiconductor pattern and having an upper surface lower than an upper surface of the single-crystalline semiconductor pattern; a mask pattern formed on the upper surface of the gate, the mask pattern having an upper surface coplanar with the upper surface of the single-crystalline semiconductor pattern; a first impurity region in the substrate under the single-crystalline semiconductor pattern; and a second impurity region under the upper surface of the single-crystalline semiconductor pattern.

In an example embodiment, the vertical-type semiconductor device may further include a spacer provided on sidewalls of the gate and the mask pattern.

According to some example embodiments, a vertical-type semiconductor device includes a substrate having an active region and an isolation region; a single-crystalline semiconductor pattern having a pillar shape disposed on the active region of the substrate; a gate surrounding sidewalls of the single-crystalline semiconductor pattern and having an upper surface lower than an upper surface of the single-crystalline semiconductor pattern, the gate having a linear shape; a mask pattern formed on the upper surface of the gate, the mask pattern having an upper surface coplanar with the upper surface of the single-crystalline semiconductor pattern; a first impurity region in the active region of the substrate under the single-crystalline semiconductor pattern; a second impurity region under the upper surface of the single-crystalline semiconductor pattern; a bit line wiring electrically connected to the first impurity region; and a contact plug electrically connected to the second impurity region.

In an example embodiment, the active region and the isolation region may have a linear shape extending in a first direction. The gate may extend in a second direction substantially perpendicular to the first direction.

In one example embodiment, the vertical-type semiconductor device may further include a spacer provided on sidewalls of the gate and the mask pattern.

In one example embodiment, the vertical-type semiconductor device may further include a first insulation interlayer filling a gap between the gate and the mask pattern and covering the single-crystalline semiconductor pattern, a pad contact adjacent to the single-crystalline semiconductor pattern to face surfaces of both the active region and the isolation region of the substrate and a second insulation interlayer covering the pad contact and the first insulation interlayer.

The bit line wiring may include a direct contact penetrating the second insulation interlayer to be connected to the pad contact and a bit line electrically connected to the direct contact.

The direct contact may be connected to a portion of an upper surface of the pad contact and may be positioned to face the isolation region.

The contact plug may have an upper surface higher than an upper surface of the bit line and the contact plug may face the upper surface of the single-crystalline semiconductor pattern.

A wiring line may be provided on the upper surface of the contact plug to apply an electrical signal to under the single-crystalline semiconductor pattern.

A data storage structure may be provided on the upper surface of the contact plug. The data storage structure may be a capacitor, a magnetoresistive tunnel junction structure or a phase changeable structure.

In one example embodiment, the gate may include a gate insulation layer provided on the sidewalls of the single-crystalline semiconductor pattern and a gate electrode provided on a surface of the gate insulation layer. The gate insulation layer may include a thermal oxidation layer formed by a thermal oxidation process.

In one example embodiment, an insulation layer may be provided between the substrate and the gate.

In one example embodiment, a channel doping region may be provided in the single-crystalline semiconductor pattern under the gate, and a threshold voltage in the channel doping region may be changed by electron-hole pair based on an electric condition between the gate, the first impurity region and the second impurity region.

According to some example embodiments, in a method of manufacturing a vertical-type semiconductor device, a first impurity region is formed in a substrate. A single-crystalline semiconductor pattern is formed on the substrate. A mask pattern is formed on upper sidewalls of the single-crystalline semiconductor pattern. The mask pattern has an upper surface coplanar with the upper surface of the single-crystalline semiconductor pattern. A gate is formed to surround sidewalls of the single-crystalline semiconductor pattern. An upper surface of the gate makes contact with a lower surface of the mask pattern. The gate has a linear shape. A second impurity region is formed under the upper surface of the single-crystalline semiconductor pattern.

In an example embodiment, the method may further include forming a spacer on both sidewalls of the gate and the mask pattern.

According to some example embodiments, in a method of manufacturing a vertical-type semiconductor device, an isolation process is performed on a substrate to form an isolation layer defining an active region and an isolation region in the substrate. A first impurity region is formed in a surface of the substrate of the active region. A single-crystalline semiconductor pattern having a pillar shape is formed on the active region of the substrate. A mask pattern is formed on upper sidewalls of the single-crystalline semiconductor pattern. The mask pattern has an upper surface coplanar with the upper surface of the single-crystalline semiconductor pattern. A gate is formed to surround sidewalls of the single-crystalline semiconductor pattern. An upper surface of the gate makes contact with a lower surface of the mask pattern. The gate has a linear shape. A second impurity region is formed under the upper surface of the single-crystalline semiconductor pattern. A bit line wiring is formed to be electrically connected to the first impurity region. A contact plug is formed to be electrically connected to the second impurity region.

In an example embodiment, the method may further include forming a first mold pattern on the substrate having the active region and the isolation region, the first mold pattern having a hole that exposes a portion of the active region.

To form the single-crystalline semiconductor pattern, a preliminary silicon layer including amorphous silicon may be formed in the hole. The preliminary silicon layer may be thermally treated to form the single-crystalline semiconductor pattern.

The method may further include forming an insulation layer pattern between the first mold pattern and the substrate.

Forming the first mold pattern may include forming a sacrificial layer and a preliminary mask layer on the substrate, the preliminary mask layer including a material having an etch selectivity with respect to the sacrificial layer.

To form the mask pattern, the first mold pattern may be patterned to form a second mold pattern having a linear shape extending in a second direction and facing with the upper sidewalls of the single-crystalline semiconductor pattern, the second mold pattern including a sacrificial layer pattern and a mask layer pattern. The mask layer pattern may be removed in the second mold pattern.

In an example embodiment, forming the gate may include forming a gate insulation layer on the sidewalls of the single-crystalline semiconductor pattern exposed under the mask pattern, forming a conductive layer to fill a gap under the mask pattern and between the mask patterns, and patterning the conductive layer to form a gate electrode under the mask pattern.

In an example embodiment, the method may further include forming a spacer on sidewalls of the gate and the mask pattern.

In an example embodiment, the method may further include forming a first insulation layer filling a gap between the gate and the mask pattern and covering the single-crystalline semiconductor pattern, forming a pad contact adjacent to the single-crystalline semiconductor pattern to face surfaces of both the active region and the isolation region of the substrate, and forming a second insulation interlayer on the pad contact and the first insulation interlayer.

To form the bit line wiring, a direct contact may be formed to penetrate the second insulation interlayer to be connected to the pad contact. A bit line may be formed to be electrically connected to the direct contact.

To form the contact plug, a third insulation interlayer may be formed on the second insulation interlayer. A contact hole may be formed to penetrate the third and second insulation interlayers to expose the upper surface of the single-crystalline semiconductor pattern. The contact hole may be filled with a conductive material to form the contact plug.

In an example embodiment, the method may further include forming an electrical charge storage device on an upper surface of the contact plug. The method may further include forming a wiring on an upper surface of the contact plug.

In an example embodiment, the method may further include forming a channel doping region under the single-crystalline semiconductor pattern making contact with the gate, wherein a threshold voltage in the channel doping region is changed by electron-hole pair based on an electrical condition between the gate, the first impurity region and the second impurity region.

According to some example embodiments, in a method of operating a vertical-type semiconductor device including a single-crystalline semiconductor pattern having a pillar shape provided on a substrate, a gate extending to surround sidewalls of the single-crystalline semiconductor pattern and having an upper surface lower than an upper surface of the single-crystalline semiconductor pattern, a first impurity region in the substrate under the single-crystalline semiconductor pattern and a second impurity region under the upper surface of the single-crystalline semiconductor pattern, a first voltage, a second voltage and a third voltage lower than the second voltage are applied to the gate, the first impurity region and the second impurity region, respectively, such that poles are accumulated in the semiconductor pattern facing with the gate to input programming data. A fourth voltage, and a fifth voltage and a sixth voltage having the opposite polarity to the fourth voltage are applied to the gate, the first impurity region and the second impurity region, respectively, such that poles are removed from the semiconductor pattern facing with the gate to input erasing data. Seventh and eighth voltages are applied to the gate and the first impurity region, respectively, to read the stored data.

The vertical-type semiconductor device according to the embodiments of the inventive concept has excellent performances. Data may be stored in the pillar-shaped single-crystalline semiconductor pattern without any defect. Accordingly, the vertical-type semiconductor device may input and output data without additional data storage structure, to thereby improve degrees of integration of the device. Further, since the mask pattern is not provided on the upper surface of the single-crystalline semiconductor pattern, the second impurity region may be easily formed to thereby reduce failures of processes. Accordingly, it is easy to manufacture a memory device of an array structure including the vertical-type pillar transistors, according to the embodiments of the inventive concept.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

Figure 1:
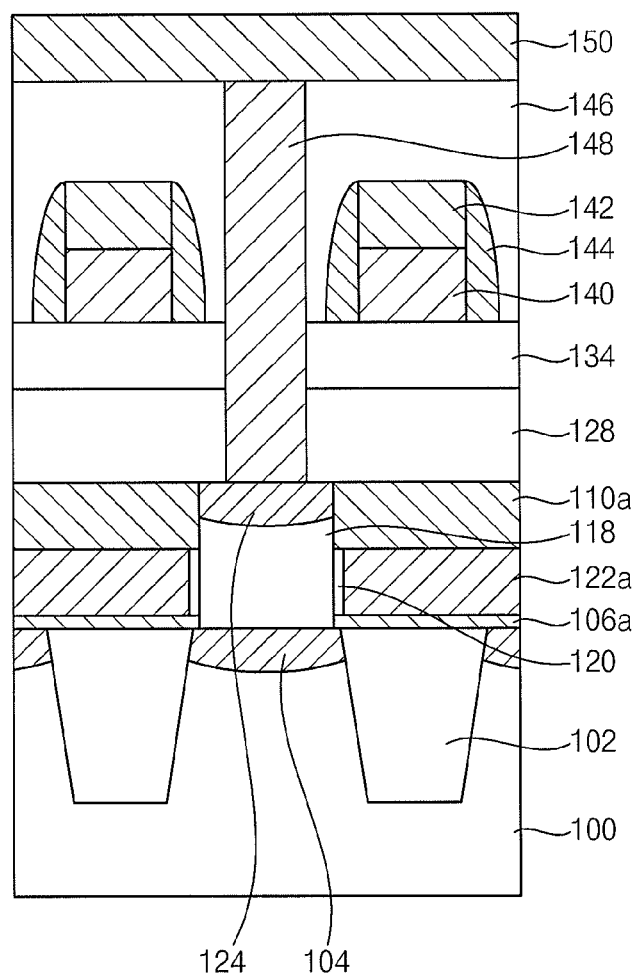
FIG. 1 is a cross-sectional view illustrating a DRAM device including a vertical-type pillar transistor in accordance with a first example embodiment.

This application claims priority under 35 U.S.C. §119 to Korean Patent Application No. 10-2008-0052368, filed on Jun. 4, 2008 in the Korean Intellectual Property Office (KIPO), the contents of which are herein incorporated by reference in their entirety.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this description will be thorough and complete, and will fully convey the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

Embodiment 1

Figure 2:
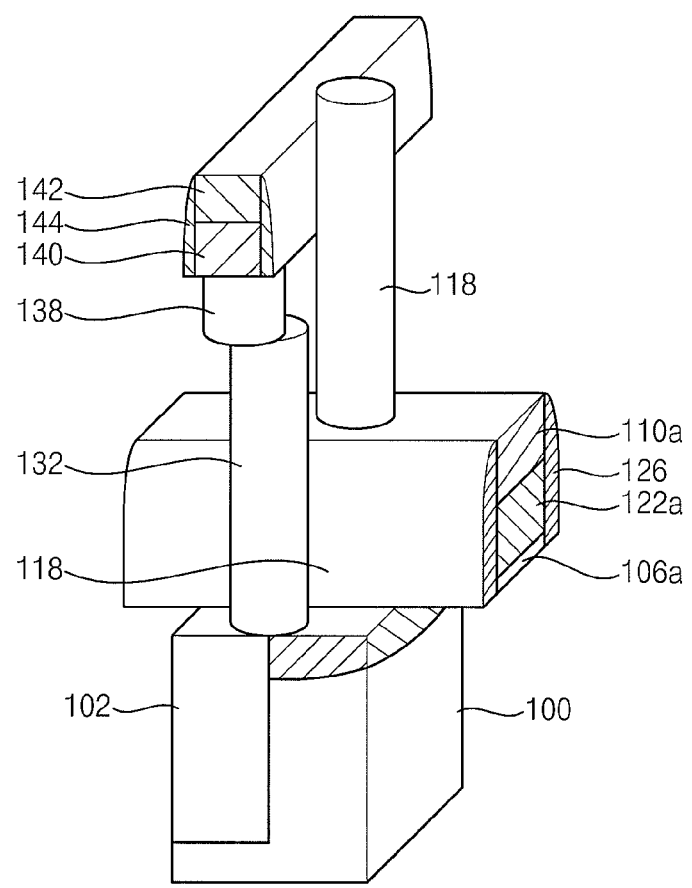
FIG. 2 is a perspective view illustrating the DRAM device in FIG. 2.

FIG. 1 is a cross-sectional view illustrating a DRAM device including a vertical-type pillar transistor in accordance with a first example embodiment. FIG. 2 is a perspective view illustrating the DRAM device in FIG. 1.

Referring to FIG. 1, a substrate 100 having an active region and an isolation region is prepared. The substrate 100 may include single-crystalline semiconductor material. For example, the substrate 100 may include single-crystalline silicon. Trenches are formed in the isolation region of the substrate 100. An isolation layer pattern 102 is formed in the trench.

The active region and the isolation region extend in a first direction. The active region and the isolation region having linear shapes are arranged alternately with one another.

A single-crystalline semiconductor pattern 118 having a pillar shape is provided on the active region of the substrate 100. The single-crystalline semiconductor pattern 118 may includes single-crystalline silicon. The single-crystalline semiconductor pattern 118 may be formed by a laser-induced epitaxial growth (LEG) process or a selective epitaxial growth (SEG) process. For example, the single-crystalline semiconductor pattern 118 may be formed by the LEG process with a relatively low crystal defect.

A gate is provided to surround sidewalls of the single-crystalline semiconductor pattern 118. The gate may have a linear shape. The gate includes a gate insulation layer 120 formed on surfaces of the sidewalls of the single-crystalline semiconductor pattern 118 and a gate electrode 122a covering surfaces of the gate insulation layer 120. The gate may have an upper surface lower than an upper surface of the single-crystalline semiconductor pattern 118.

The sidewall surfaces of the single-crystalline semiconductor pattern 118 may be thermally oxidized to form the gate insulation layer 120. The gate electrode 122a may have a gate-all-around structure where the gate electrode 122a surrounds the sidewalls of the single-crystalline semiconductor pattern 118 in the overlapping thereof.

The gate electrode 122a may have a linear shape extending in a second direction perpendicular to the first direction. That is, the gate electrode extends to cross over the active region. Channel impurities may be doped in a region of the single-crystalline semiconductor pattern 118 facing the gate electrode 122a.

A first hard mask pattern 110a is provided on an upper surface of the gate electrode 122a. The first hard mask pattern 110a may be an upper surface coplanar with that of the single-crystalline semiconductor pattern 118. The first hard mask pattern 110a covers the upper surface of the gate electrode 122a. The first hard mask pattern 110a may include silicon nitride.

An insulation layer pattern 106a is provided between the substrate 100 and a lower surface of the gate electrode 122a. The gate electrode 122a may be electrically insulated from the substrate by the insulation layer pattern 106a. The insulation layer pattern 106a may include silicon nitride.

A spacer 126 is provided on both sidewalls of the gate electrodes 122a. A first insulation interlayer 128 is provided to fill a gap between the spacers 126.

A first impurity region 104 is provided in the active region under the single-crystalline semiconductor pattern 118. A second impurity region 124 is provided under the upper surface of the single-crystalline semiconductor pattern 118. The first and second impurity regions 104 and 124 may be used as a source and a drain of the transistor.

The single-crystalline semiconductor pattern 118 may be used as a channel region for the vertical-type transistor. The channel region is surrounded by the gate electrode 122a to have a shape of a floating body. The channel region of the floating body shape may be provided as a data storage region. For example, as poles are accumulated in or removed from the channel region, a threshold voltage of the vertical-type transistor may be changed to store data.

A pad contact 132 is provided to apply an electrical signal to the first impurity region 104. The pad contact 132 penetrates the first insulation interlayer to make contact with surfaces of both the first impurity region and the adjacent isolation layer pattern 102. The pad contact 132 may be formed by a self-aligned contact process.

A second insulation interlayer 134 is provided to cover the pad contact 132 and the first hard mask pattern 110a. A direct contact 138 is provided to make contact with a portion of the pad contact 32. For example, the direct contact 138 may not cover the entire upper surface of the pad contact 132, and the direct contact 138 may be arranged to move left or right in the second direction from the position facing the pad contact 132 such that the direct contact 138 makes contact with a portion of the upper surface of the pad contact 132.

A bit line 140 is provided to be electrically to the pad contact 132 through the direct contact 138. The bit line 140 extends in the first direction. The bit line 140 may not cover the entire upper surface of the pad contact 132, and the bit line 140 may cover a portion of the upper surface of the pad contact 132.

A second hard mask pattern 142 is provided on the bit line 142. A second spacer 144 is provided on sidewalls of the bit line 140.

A third insulation interlayer 146 is provided to fill a gap between the bit lines 140 and to cover the bit line 140.

A contact plug 148 is provided to penetrate the third and second insulation interlayers 146 and 134 to be connected to the upper surface of the single-crystalline semiconductor pattern 118. The contact plug 148 is positioned between the bit lines 140. The contact plug 148 is electrically insulated from the bit line 140. The contact plug 148 makes contact with the upper surface of the single-crystalline semiconductor pattern 118. That is, the contact plug 148 is electrically connected to the second impurity region 124.

The contact plug 148 may include metal. Alternatively, the contact plug 148 may include polysilicon.

A wiring 150 is provided on the contact plug 148 to input/output an electrical signal to/from the second impurity region. The wiring 150 may include metal having a low resistance. The wiring 150 may have a linear shape extending the second direction.

The DRAM device according to this embodiment includes the vertical-type pillar transistor having single-crystalline semiconductor without any defect. Accordingly, due to the vertical-type pillar transistor, the DRAM device may be formed to be highly integrated and provide excellent electrical properties.

When a line and space of each of the patterns in the DRAM device formed by using a photolithography process has a critical line width (F), formation of unit cell per dimension of $4F^2$ may be feasible.

Further, since data is stored in the channel region of the vertical-type pillar transistor, an additional capacitor need not to be provided in every unit cell of the DRAM device. That is, the channel region may be used as an electrical charge storage region such that a hole is injected into or removed from the channel region by impact ionization or avalanche.

Therefore, a process of forming a capacitor may be omitted to increase productivity.

Hereinafter, a method of operating the DRAM device in FIGS. 1 and 2 will be described.

First, a method of writing data in the DRAM device will be described. To input a programming data, a first voltage, a second voltage and a third voltage lower than the second voltage are applied to the gate, the first impurity region and the second impurity region, respectively, to accumulate poles in the semiconductor pattern facing with the gate. Accordingly, the poles are accumulated in the semiconductor pattern to decrease a threshold voltage.

To input an erasing data, a fourth voltage, and a fifth voltage and a sixth voltage having the opposite polarity to the fourth voltage are applied to the gate, the first impurity region and the second impurity region, respectively, to remove poles from the semiconductor pattern facing with the gate. Accordingly, the poles are removed from the semiconductor pattern to increase a threshold voltage.

Seventh and eighth voltages are applied to the gate and the first impurity region, respectively, to read the stored data.

FIGS. 3 to 20 are cross-sectional views illustrating a method of manufacturing a DRAM device including a vertical-type pillar transistor in accordance with a first example embodiment. FIGS. 3 to 7, 16, 18 and 20 are cross-sectional views taken in a second direction in which active regions are spaced apart from one another. FIGS. 8 to 15, 17 and 19 are cross-sectional views taken in a first direction perpendicular to the second direction.

Figure 21:
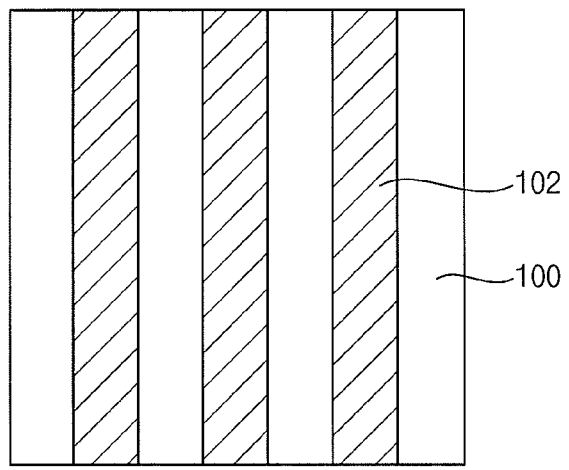
FIGS. 21 to 23 are plan views illustrating a method of manufacturing a DRAM device in accordance with a first example embodiment.
Figure 22:
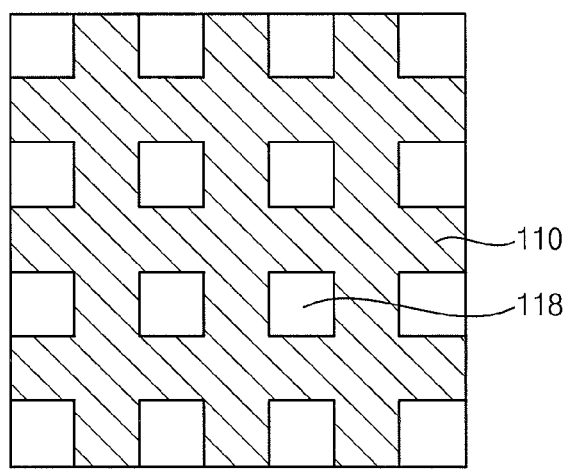
Figure 23:
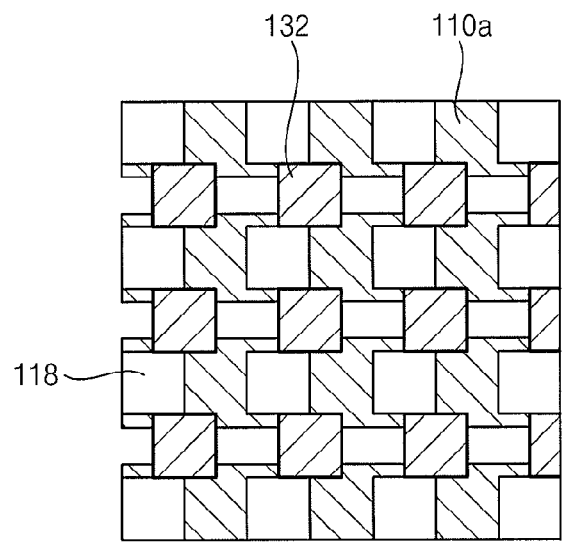

FIGS. 21 to 23 are plan views illustrating a method of manufacturing a DRAM device in accordance with a first example embodiment. FIGS. 24 to 27 are perspective views illustrating a method of manufacturing a DRAM device in accordance with a first example embodiment.

Figure 3:
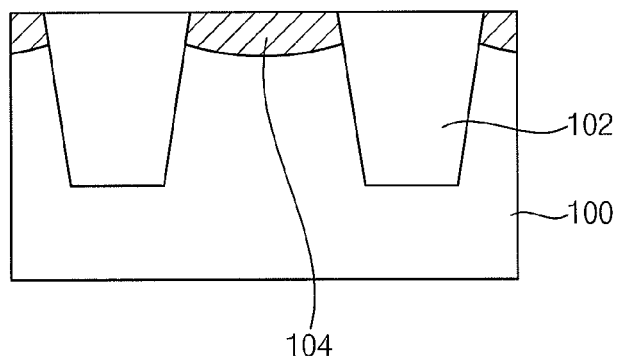
FIGS. 3 to 20 are cross-sectional views illustrating a method of manufacturing a DRAM device including a vertical-type pillar transistor in accordance with a first example embodiment.

Referring to FIGS. 3 and 21, a substrate 100 including single-crystalline semiconductor is prepared. The substrate 100 may include single-crystalline silicon.

An isolation layer pattern 102 is formed in an isolation region of the substrate 100 by a shallow trench isolation process. The substrate 100 is partially etched to form trenches extending in a first direction, and then the trenches are filled with insulation layers to form the isolation layer patterns 102. The trenches are spaced apart from one another.

By forming the isolation layer pattern 102, the substrate 100 is divided into an active region and an isolation region. As illustrated in FIG. 21, the active region and the isolation region having linear shapes are arranged alternately with one another.

Impurities are implanted into the substrate 100 including the isolation layer pattern 102 formed therein to form a first impurity region 104. In this embodiment, N type impurities may be implanted by an ion implantation process to form the first impurity region 104.

Alternatively, before forming the isolation layer pattern 102, an ion implantation process may be performed on the entire surface of the substrate 100. In this case, during the process of forming the isolation layer pattern 102, the impurities in the isolation region are removed to form the first impurity region in the active region.

Figure 4:
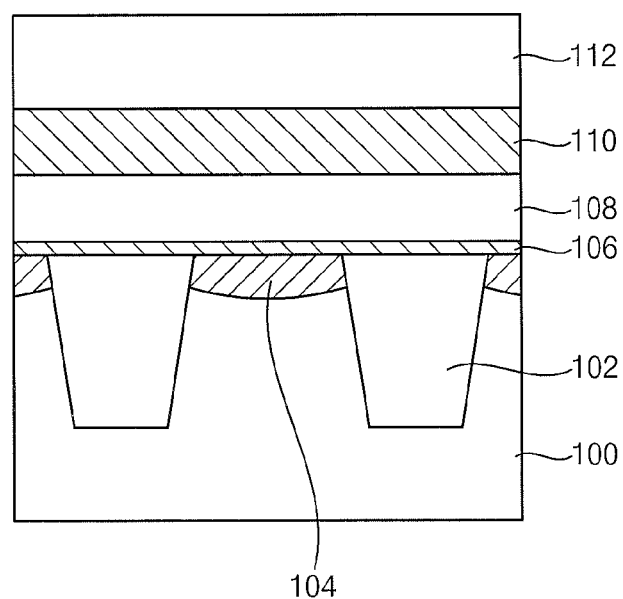

Referring to FIG. 4, an insulation layer 106, a first sacrificial layer 108, a first hard mask layer 110 and a second sacrificial layer 112 are sequentially formed on the substrate 100. The first sacrificial layer 108 may include a material having an etch selectivity with respect to the first hard mask layer 110 and the insulation layer 106. During the process of removing the first sacrificial layer 108, the first hard mask layer 110 and the insulation layer 106 may not be removed to remain. Accordingly, the first hard mask 110 and the insulation layer 106 may include the same material.

For example, the insulation layer 106 and the first hard mask layer 110 may be formed using silicon nitride. The first and second sacrificial layers 108 and 112 may be formed using silicon oxide. The first and second sacrificial layers 108 and 112 may include silicon oxide that is formed by high density plasma chemical vapor deposition process.

The first sacrificial layer 108 may be etched by a subsequent etching process to define a region for a gate electrode to be formed. Therefore, the first sacrificial layer 108 may have a thickness the same as that of the gate electrode to be formed.

The first hard mask layer 110 may define a height of a single-crystalline semiconductor pattern to be formed. The first hard mask layer 110 may define a width of a second impurity region of a vertical-type pillar transistor. Accordingly, by controlling a height of the first hard mask layer 110, the height of the single-crystalline semiconductor pattern and the width of the upper impurity region may be controlled.

Figure 5:
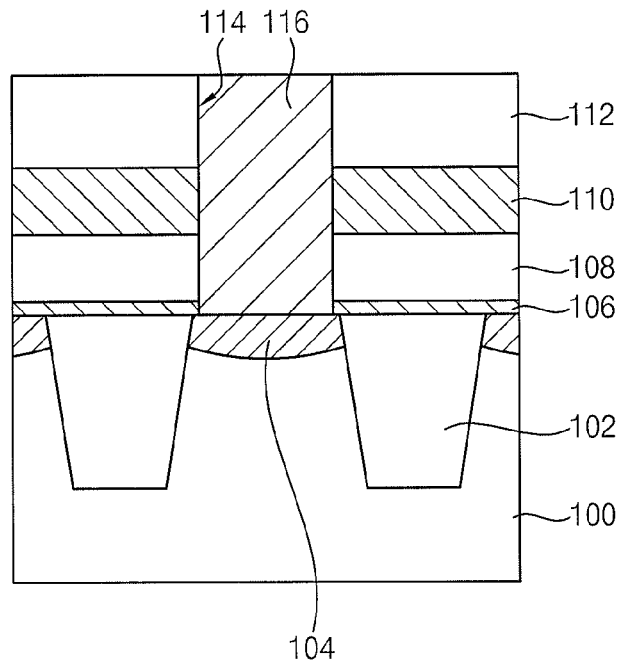

Referring to FIG. 5, a photoresist layer is coated on the second sacrificial layer 112, and then is patterned to form a first photoresist pattern (not illustrated). The first photoresist pattern may selectively expose a region for the single-crystalline semiconductor pattern to be formed. The exposing portions of the first photoresist pattern are spaced apart from one another by a predetermined distance and are arranged repeatedly, facing the active region of the substrate 100.

The second sacrificial layer 112, the first hard mask layer 110, the first sacrificial layer 108 and the insulation layer 106 are sequentially etched using the first photoresist pattern as a mask to form a first opening 114. The first opening 114 may have a contact hole shape.

An amorphous silicon layer (not illustrated) is deposited to fill the first opening 114. The amorphous silicon layer may be deposited by a low pressure chemical vapor deposition process. In the process, the amorphous silicon layer may be doped with P type impurities in-situ. Thus, a channel region of the vertical-type transistor may be doped with the impurities.

The amorphous silicon layer is planarized until an upper surface of the second sacrificial layer 112 is exposed, to form a preliminary semiconductor pattern 116.

Figure 6:
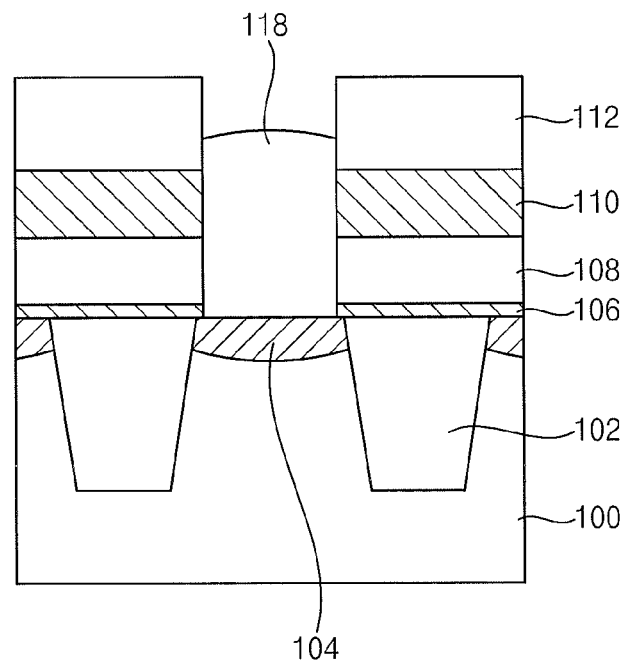

Referring to FIG. 6, the preliminary semiconductor pattern 116 is thermally treated to form a single-crystalline semiconductor pattern 118 including single-crystalline silicon.

The single-crystalline semiconductor pattern 118 may be formed by a laser-induced epitaxial growth (LEG) process or a solid phase epitaxy (SPE) process. For example, the thermal treatment process may be performed using a laser or a furnace.

In the LEG process, the laser used for the thermal treatment may have an energy density to completely melt the preliminary semiconductor pattern.

As a laser beam is irradiated to melt the preliminary semiconductor pattern 116, the amorphous silicon is changed from a solid phase to a liquid phase. The phase transition occurs from an upper surface of the preliminary semiconductor pattern 116 to an upper surface of the substrate 100 beneath a bottom surface of the first opening 114. For example, the laser beam may be irradiated at a temperature of about 1,410° C., the melting point of silicon.

Accordingly, the single crystal in the substrate 100 is used as a seed for the liquefied preliminary semiconductor pattern 116, and thus the crystal structure of the preliminary semiconductor pattern 116 is changed to single crystal structure. For example, an excimer laser as a kind of a gas laser may be used as a laser member for irradiating the laser beam. The laser member may irradiate the laser beam having a scanning type, and thus the laser beam may be irradiated in a relatively short time.

While the laser beam is irradiated, the substrate 100 may be heated together. Thus, when the preliminary semiconductor pattern 116 undergoes a phase transition by the irradiation of the laser beam, the substrate 100 is heated together to thereby reduce a temperature gradient in a layer where the phase transition occurs. For example, when the laser beam is irradiated, the substrate 100 may be heated to about 400° C.

Thus, the laser beam is irradiated to the preliminary semiconductor pattern 116 to change the crystal structure of the preliminary semiconductor pattern 116 into single-crystalline silicon, to thereby form a single-crystalline semiconductor pattern 118. As the single-crystalline semiconductor pattern 118 is formed to shrink from the preliminary semiconductor pattern 116, the height of the single-crystalline semiconductor pattern 118 may become less than that of the preliminary semiconductor pattern 116.

Figure 7:
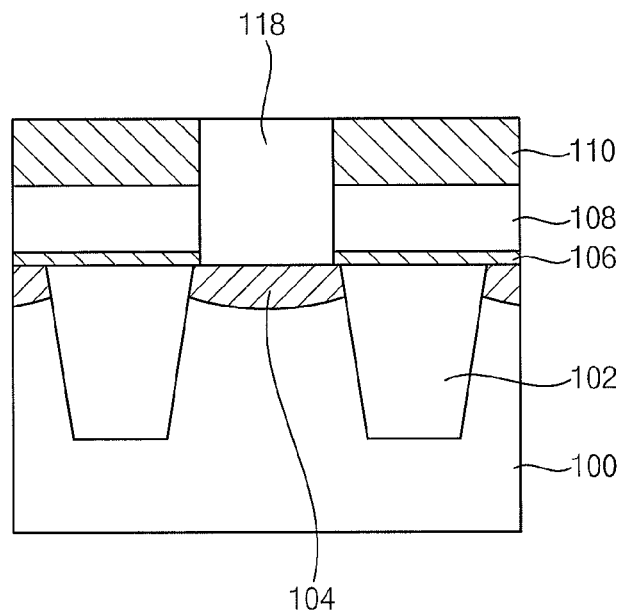

Referring to FIG. 7, the single-crystalline semiconductor pattern 118 and the second sacrificial layer 112 are planarized to expose the first hard mask layer 110. Thus, the second sacrificial layer 112 may be removed completely by the planarization process. An upper surface of the planarized single-crystalline semiconductor pattern 118 may be coplanar with an upper surface of the first hard mask layer 110.

Although not illustrated in the figure, in an example embodiment, after forming the single-crystalline semiconductor pattern 118, impurities may be implanted into the exposed upper surface of the single-crystalline semiconductor pattern 118 to form the second impurity region. Alternatively, the second impurity region may be formed by a following process.

After forming the second impurity region, a protecting layer may be further formed on the single-crystalline semiconductor pattern 118 and the first hard mask layer 110.

FIG. 22 is a plan view illustrating a structure formed by performing the processes described with reference to FIGS. 3 to 7.

As illustrated in FIG. 22, the single-crystalline semiconductor patterns 118 having isolated shapes are arranged at regular intervals. The upper surfaces of the first hard mask layer 110 and the single-crystalline semiconductor pattern 118 are coplanar with each other.

Figure 24:
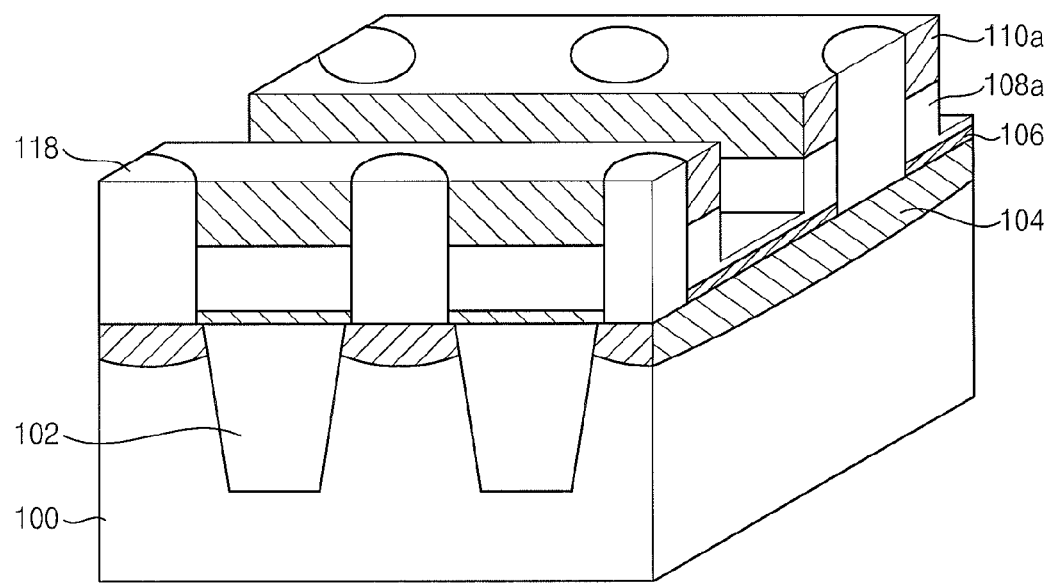
FIGS. 24 to 27 are perspective views illustrating a method of manufacturing a DRAM device in accordance with a first example embodiment.

FIGS. 8 to 15 are cross-sectional views taken in the first direction perpendicular to the cutting plane direction in FIGS. 3 to 7. FIG. 24 is a perspective view illustrating the structure in FIG. 8.

Figure 8:
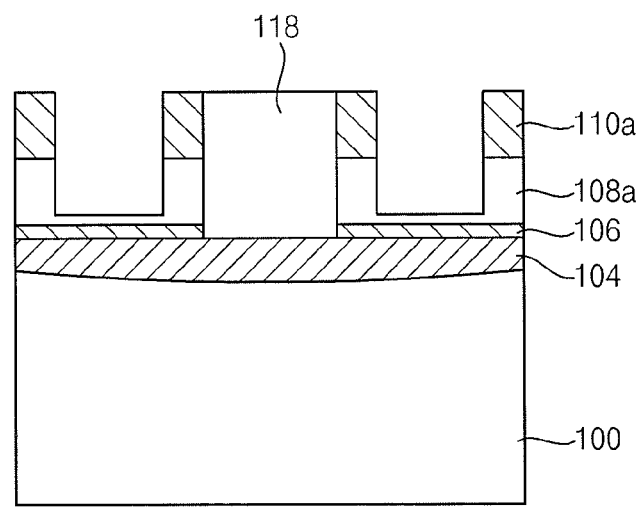

Referring to FIGS. 8 and 24, a photoresist layer is formed on the first hard mask layer 110 and the single-crystalline semiconductor pattern 118 and then is patterned to form a second photoresist pattern (not illustrated) having a linear shape. The second photoresist pattern may have a linear shape extending in the second direction perpendicular to the first direction. The second photoresist pattern covers the single-crystalline semiconductor pattern 118.

The first hard mask layer 110 is anisotropically etched using the second photoresist pattern as an etching mask, and then, as illustrated in the figures, a portion of the first sacrificial layer 108 under the first hard mask layer 110 is anisotropically etched. Alternatively, the process of anisotropically etching the first sacrificial layer 108 may be omitted.

By performing the anisotropic etching process, a first hard mask pattern 110a is formed to have a linear shape extending in the second direction. The first hard mask pattern 110a surrounds sidewalls of the single-crystalline semiconductor pattern 118 that is arranged parallel with the second direction. Additionally, a first sacrificial layer pattern 108a is formed under the first hard mask pattern 110a.

Figure 9:
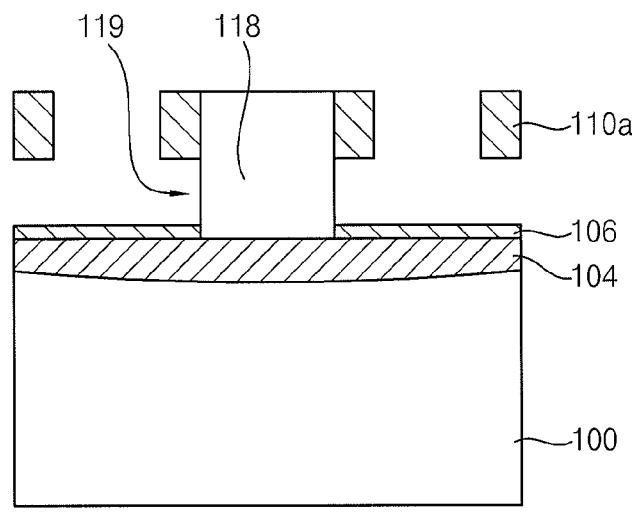
Figure 25:
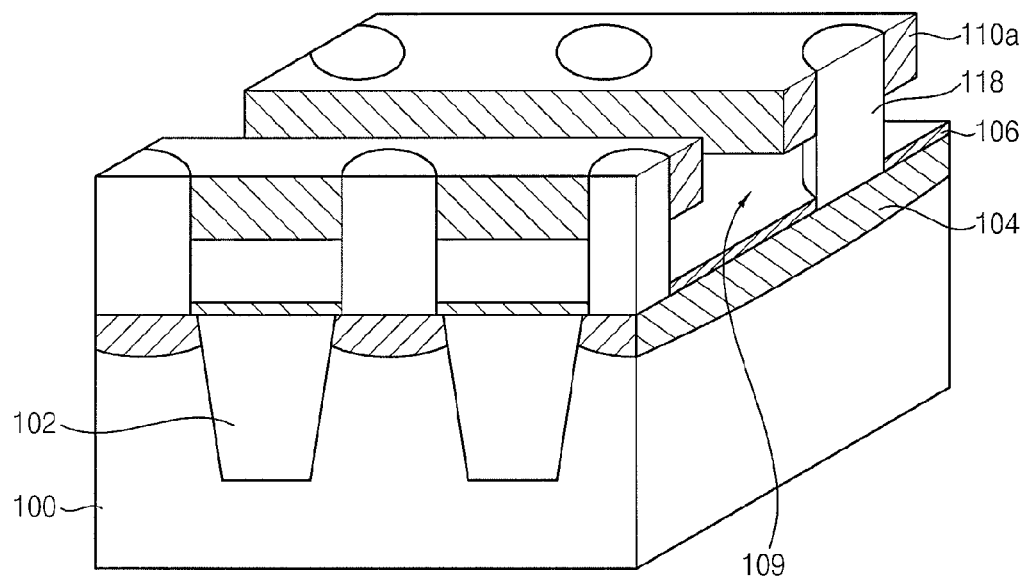

FIG. 25 is a perspective view illustrating the structure in FIG. 9.

Referring to FIGS. 9 and 25, the first sacrificial layer pattern 108a is removed by an isotropic etching process.

By performing the etching process, the linear shaped first hard mask pattern 110a remains surrounding the upper sidewalls of the single-crystalline semiconductor pattern 118. Thus, a gap 119 is formed under the first hard mask pattern 110a and between the first hard mask patterns 110a. That is, the first hard mask pattern 110a may have the linear shape surrounding the single-crystalline semiconductor patterns 118 without being supported by an underlying layer. Accordingly, the sidewall of the single-crystalline semiconductor pattern 118 is partially exposed under the first hard mask pattern 110a. A gate is formed on the exposed sidewall of the single-crystalline semiconductor pattern 118 by a subsequent process.

Figure 10:
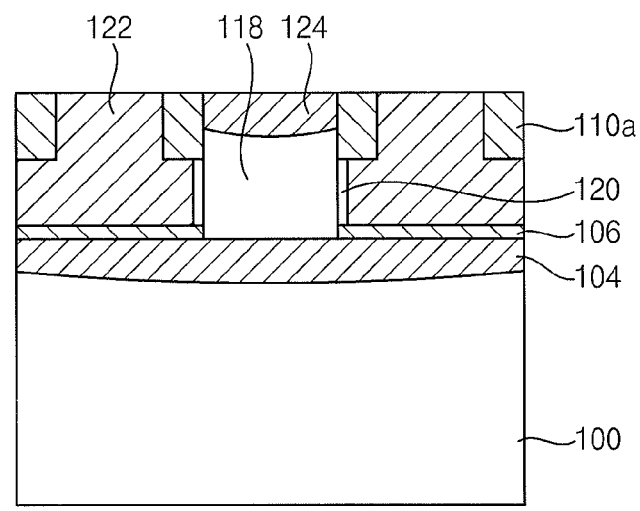

Referring to FIG. 10, the exposed sidewall of the single-crystalline semiconductor pattern 118 is thermally oxidized to form a gate insulation layer 120. The gate insulation layer 120 may be formed using silicon oxide by a thermal oxidation process. The gate insulation layer 120 may have a ring shape surrounding the sidewalls of the single-crystalline semiconductor pattern 118.

A polysilicon layer (not illustrated) is deposited to fill the gap under the first hard mask pattern 110a and between the first hard mask patterns 110a. When the process of depositing the polysilicon layer is performed, n-type impurities may be doped in-situ.

After depositing the polysilicon layer, the polysilicon layer is planarized until an upper surface of the first hard mask pattern 110a is exposed. By performing the planarization process, a polysilicon pattern 122 is formed to have an upper surface coplanar with that of the first hard mask pattern 110a. As a result, the upper surface of the single-crystalline semiconductor pattern 118 is exposed.

In the process of planarizing the polysilicon layer, the first hard mask pattern 110a may be used as a polishing stop layer. Because the planarization process is discontinued when the first hard mask pattern 110a is exposed, the polysilicon layer is prevented from dishing over a relatively wide region during the planarization process.

Impurities are implanted into the exposed upper surface of the single-crystalline semiconductor pattern 118 to form a second impurity region 124. Since the polysilicon pattern 122 is provided on both sides of the single-crystalline semiconductor pattern 122, only the upper surface of the single-crystalline semiconductor pattern 118 is exposed. Accordingly, the doping height of the second impurity region 124 may be readily controlled.

Alternatively, as described above, the second impurity region 124 may be formed by a previous process.

Figure 11:
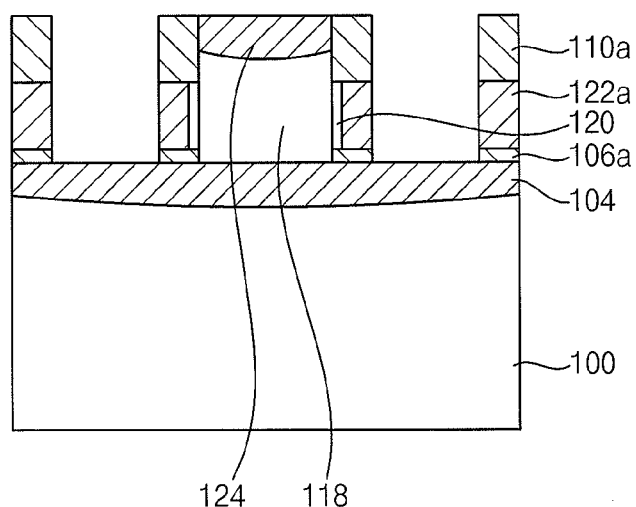
Figure 26:
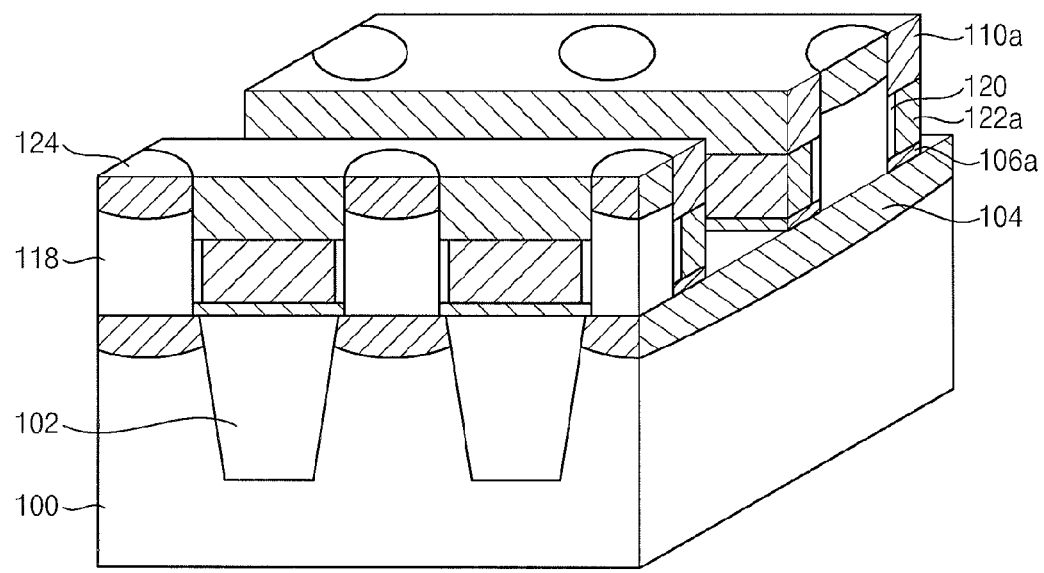

FIG. 26 is a perspective view illustrating the structure in FIG. 11.

Referring to FIGS. 11 and 26, the polysilicon pattern 122 is etched using the first hard mask pattern 110a as an etching mask to form a gate electrode 122a.

Before performing the etching process, a photoresist pattern (not illustrated) may be further formed to cover the first hard mask pattern 110a and the single-crystalline semiconductor pattern 118. While performing the etching process, the photoresist pattern may protect the upper surface of the single-crystalline semiconductor pattern 118.

The gate electrode 122a may have a linear shape extending in the second direction to surround the sidewalls of the single-crystalline semiconductor pattern 118.

The above-mentioned processes are performed to form a vertical-type transistor. The single-crystalline semiconductor pattern 118 may be provided as a channel region of the vertical-type transistor. The channel region may be completely surrounded by the gate electrode 122a to have a shape of a floating body, and data may be stored in the channel region.

Figure 12:
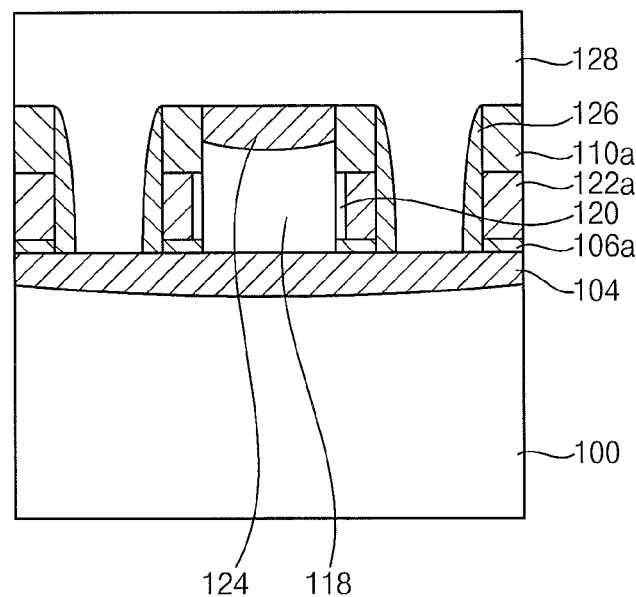

Referring to FIG. 12, an insulation layer for a spacer (not illustrated) is formed on the gate electrode 122a, the surface of the first hard mask pattern 110a and the surface of the substrate exposed through the gap between the first hard mask patterns 110a. The insulation layer for a spacer may be formed using silicon nitride.

The insulation layer for a spacer is anisotropically etched to form a spacer 126 on both sidewalls of the gate electrode 122a and the first hard mask pattern 110a.

A first insulation interlayer 128 is formed to fill a gap between the spacers 126 and to cover the first hard mask pattern 110a. The first insulation interlayer may be formed using silicon oxide.

After forming the first insulation interlayer 128, a process of planarizing an upper surface of the first insulation interlayer 128 may be further performed.

Figure 13:
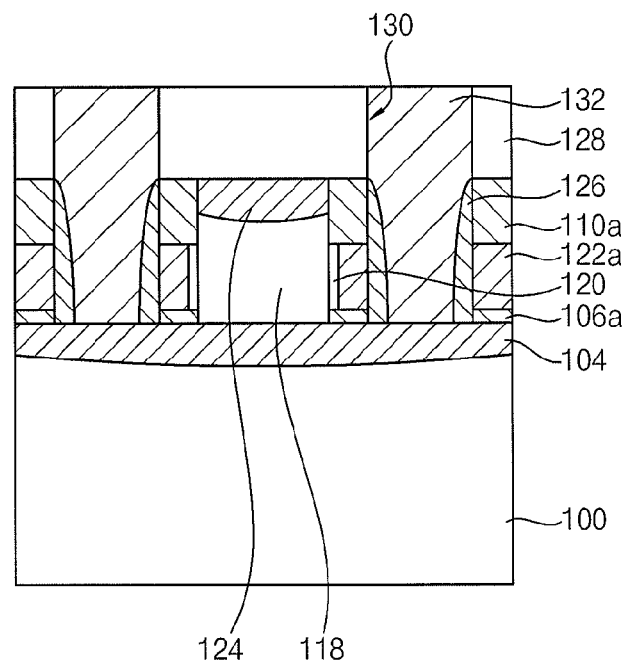

FIG. 23 is a plan view illustrating the structure in FIG. 13.

Referring to FIGS. 13 and 23, a portion of the first insulation interlayer 128 is anisotropically etched to form a contact hole 130 that exposes the active region of the substrate 100. The contact hole 130 may be formed to expose both the active region and the isolation region adjacent to the single-crystalline semiconductor pattern 118. The contact hole 130 may be formed by a self-align etching process using etch selectivity of the spacer 126 and the first insulation interlayer 128.

A conductive layer (not illustrated) is formed to fill the contact hole 130. For example, the conductive layer may be formed using polysilicon doped with impurities. Alternatively, the conductive layer may be formed using metal. The conductive layer is planarized until the first insulation interlayer 128 is exposed, to form a pad contact 132.

As illustrated in FIG. 23, the pad contact 132 may be arranged left or right in the second direction from the position facing the single-crystalline semiconductor pattern 118. Thus, the pad contact 132 may not be aligned directly only on the active region, but may be aligned to face both the active region and the isolation region.

Figure 14:
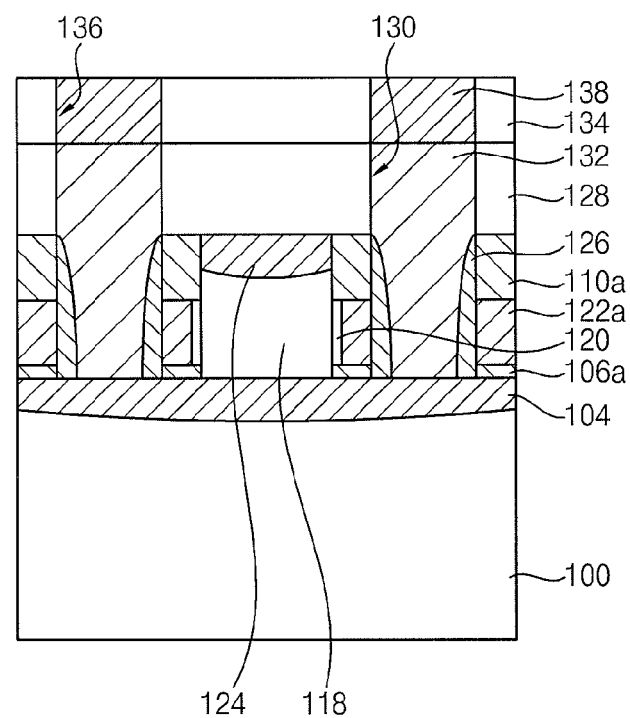

Referring to FIG. 14, a second insulation interlayer 134 is formed on the pad contact 132 and the first hard mask pattern 110a. The second insulation interlayer 134 may be formed using silicon oxide.

The second insulation interlayer 134 is partially etched to form a second contact hole 136 that partially exposes the pad contact 132. The second contact hole 136 may be positioned at a position between the single-crystalline semiconductor patterns 118 that are arranged diagonally to each other. Also, the second contact hole 136 may be positioned to face the isolation region.

After a conductive layer is deposited to fill the second contact hole 136, the conductive layer is planarized until the second insulation interlayer 134 is exposed, to form a direct contact 138.

The pad contact 132 is arranged left or right in the second direction from the position facing the single-crystalline semiconductor pattern 118, and the direct contact 138 is arranged in the second direction from the position facing the pad contact 132 such that the direct contact 138 is further from the single-crystalline semiconductor pattern 118 than the pad contact 132. Accordingly, upper surfaces of the direct contacts 138 may be repeatedly arranged between the single-crystalline semiconductor patterns 118.

Figure 15:
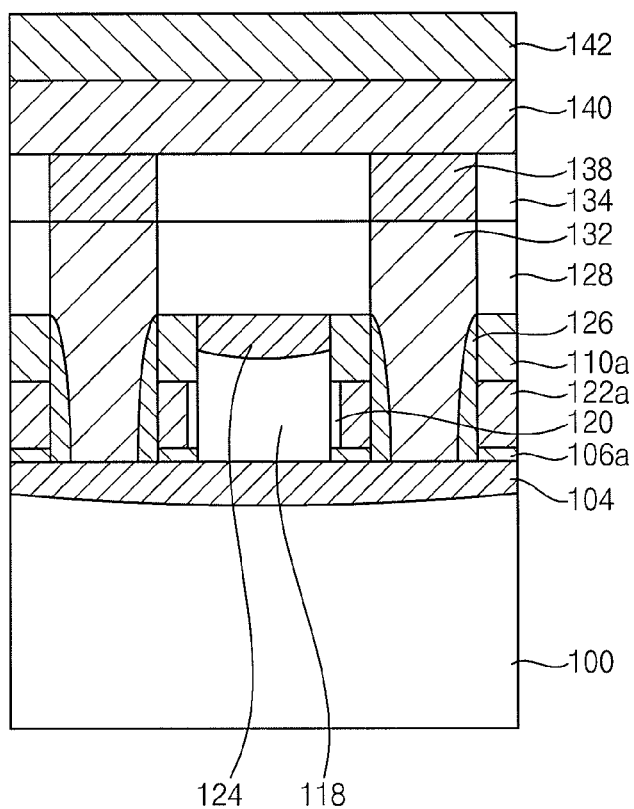
Figure 16:
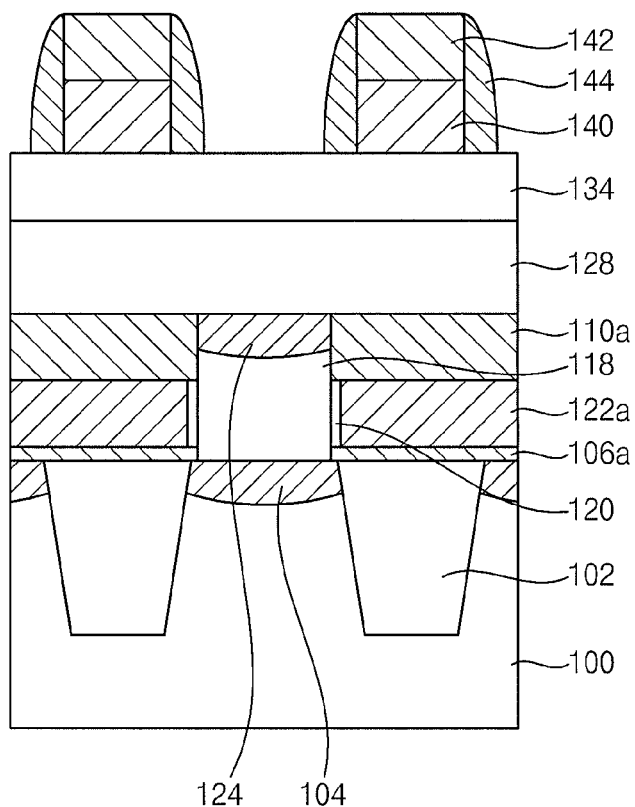
Figure 17:
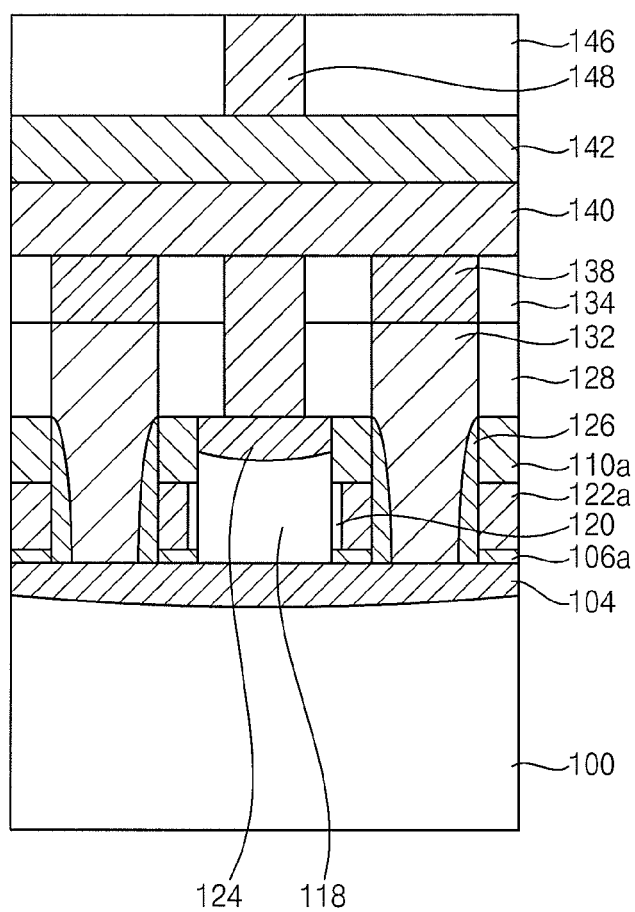
Figure 18:
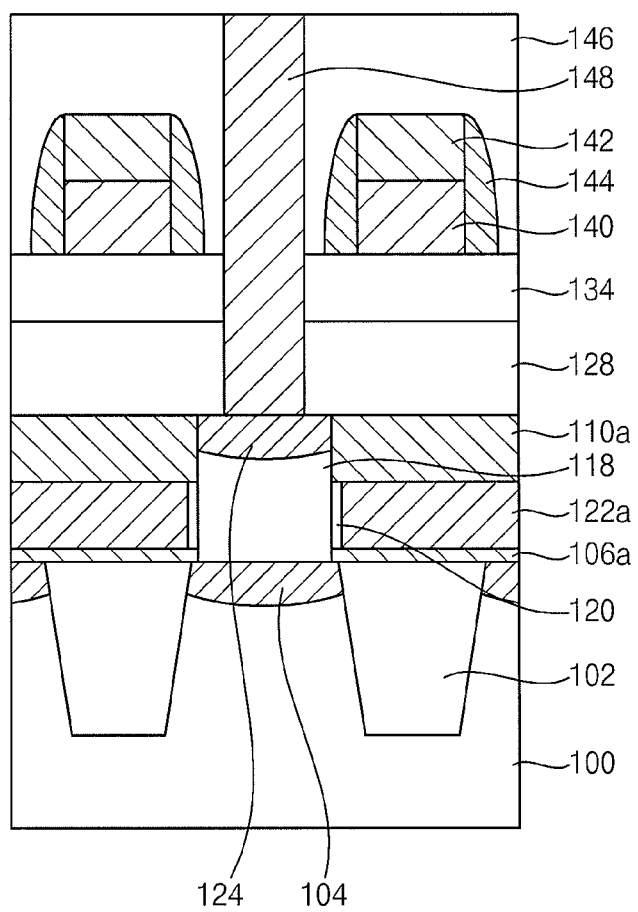
Figure 19:
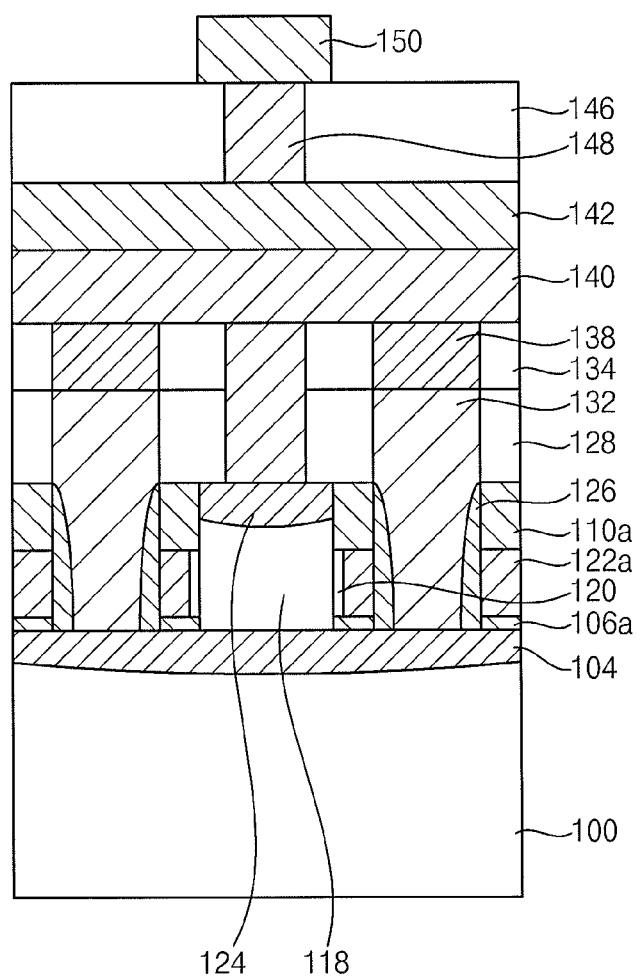
Figure 20:
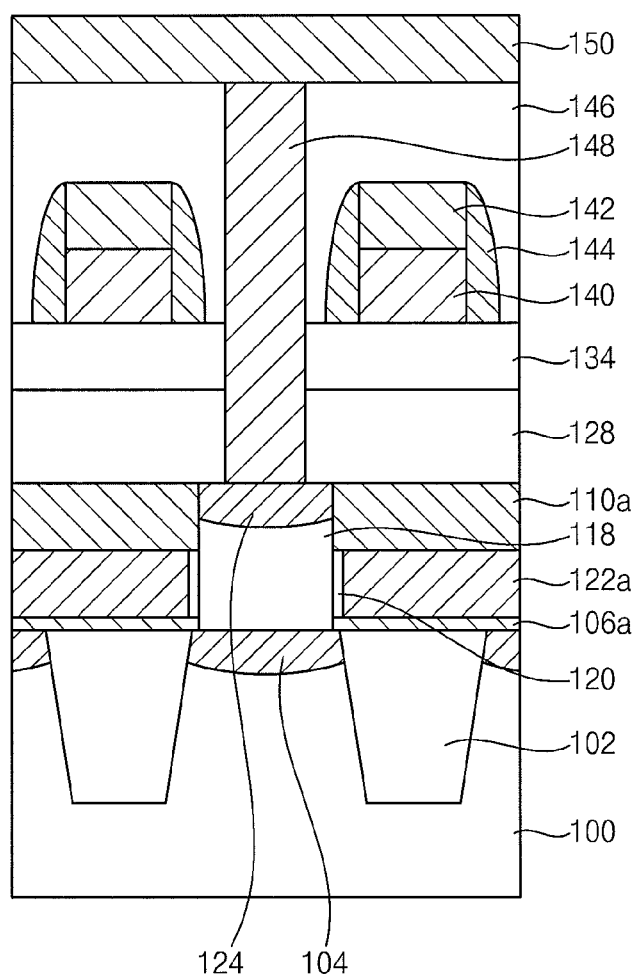
Figure 27:
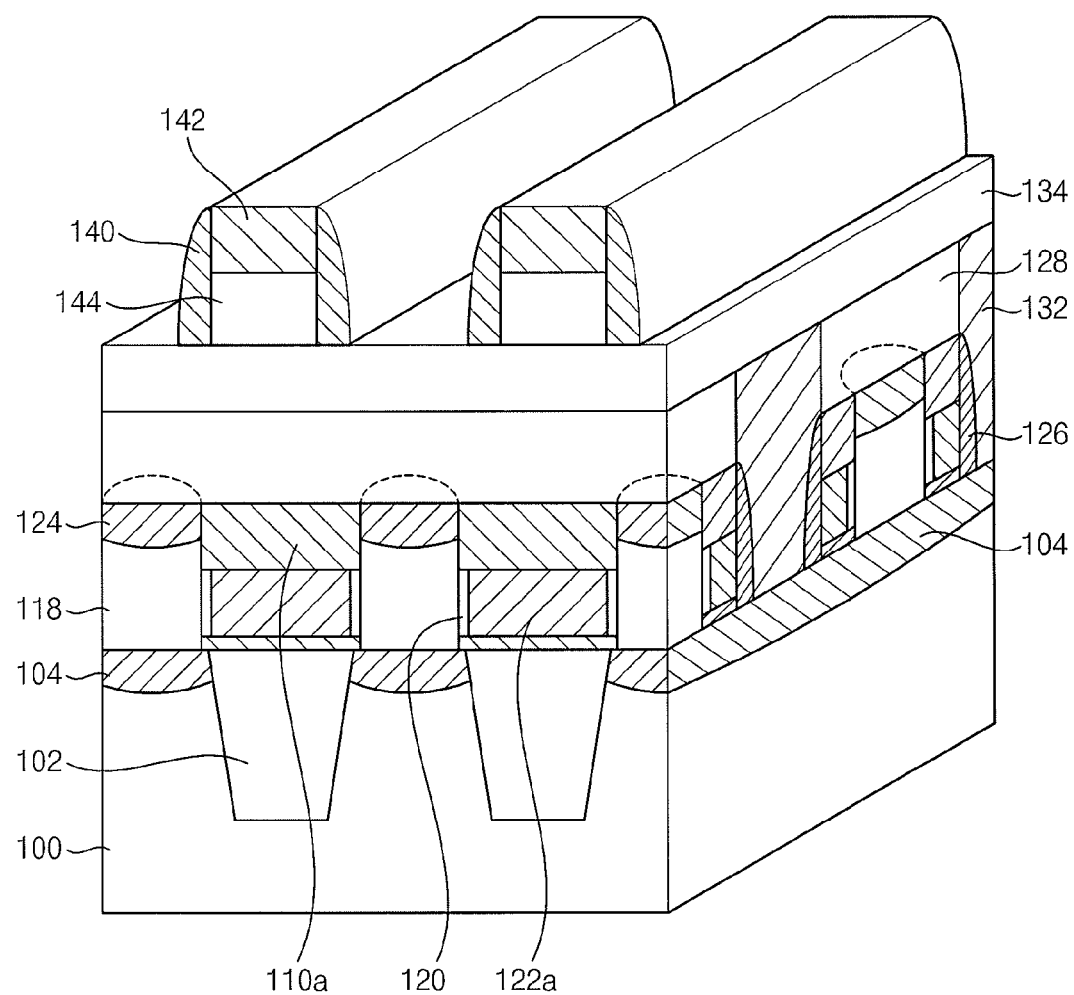

FIGS. 15, 17 and 19 are cross-sectional views taken in the first direction. FIGS. 16, 18 and 20 are cross-sectional views taken in the second direction. FIG. 27 is a perspective view illustrating the structure in FIG. 15.

Referring to FIGS. 15, 16 and 27, a conductive layer for a bit line (not illustrated) is formed on the direct contact 138. The conductive layer for a bit line may be formed using polysilicon, metal, metal silicide, etc. These may be used alone or in a combination.

A second hard mask pattern 142 is formed on the conductive layer for a bit line. A silicon nitride layer may be deposited and patterned to form the second hard mask pattern 142. The second hard mask pattern 142 may have a linear shape extending in the first direction to face the direct contact.

The conductive layer for a bit line may be anisotropically etched using the second hard mask pattern 142 as an etching mask to form a bit line 140. The bit line 140 is positioned between the single-crystalline semiconductor patterns 118 that are arranged parallel with the first direction.

An insulation layer for a spacer (not illustrated) is formed on surfaces of the bit line 140, the second hard mask pattern 142 and the second insulation interlayer 134. The insulation for a spacer may be anisotropically etched to form a second spacer 144 on both sides of the bit line 140 and the second hard mask pattern 142. The second spacer 144 may include silicon nitride.

Referring to FIGS. 17 and 18, a third insulation interlayer 146 is formed to fill a gap between the bit lines 140 and to cover the bit lines 140. The third insulation interlayer 146 may be formed using silicon oxide.

Portions of the third, second and first insulation interlayers 146, 134 and 128 between the bit lines 140 may be anisotropically etched to form contact holes that expose the upper surfaces of the single-crystalline semiconductor patterns 118 respectively. The anisotropic etching process may be formed by a self-aligned contact process using etch selectivity of the second spacer 144 and the third insulation interlayer 146.

A conductive material is formed to fill the contact hole and is planarized until the third insulation interlayer 146 is exposed, to form a contact plug 148. The conductive material may include metal. As the conductive material includes metal, the resistance of the contact plug 146 may be reduced. Alternatively, the conductive material may include polysilicon.

Referring to FIGS. 19 and 20, a wiring 150 is formed on the contact plug 148. The wiring 150 may include metal. For example, a metal layer may be formed on the contact plug 148 and is patterned to form the wiring 150. The wiring 150 may have a linear shape extending the second direction to apply an electrical signal to the contact plug 148.

As mentioned above, a capacitor may not be provided in the DRAM device formed by the processes described above. That is, a hole may be formed into or removed from the pillar type single-crystalline semiconductor pattern using a floating body effect to store data. Accordingly, complicated processes for forming the capacitor may be omitted to thereby simplify processes of manufacturing a device.

Further, in the process of planarizing the polysilicon layer used as a gate electrode, the first hard mask pattern may be used as a polishing stop layer to thereby reduce dishing over of the polysilicon layer.

Further, the contact holes included in the DRAM device may be formed using a self-aligned contact process to thereby form the contacts accurately.

Embodiment 2

Figure 28:
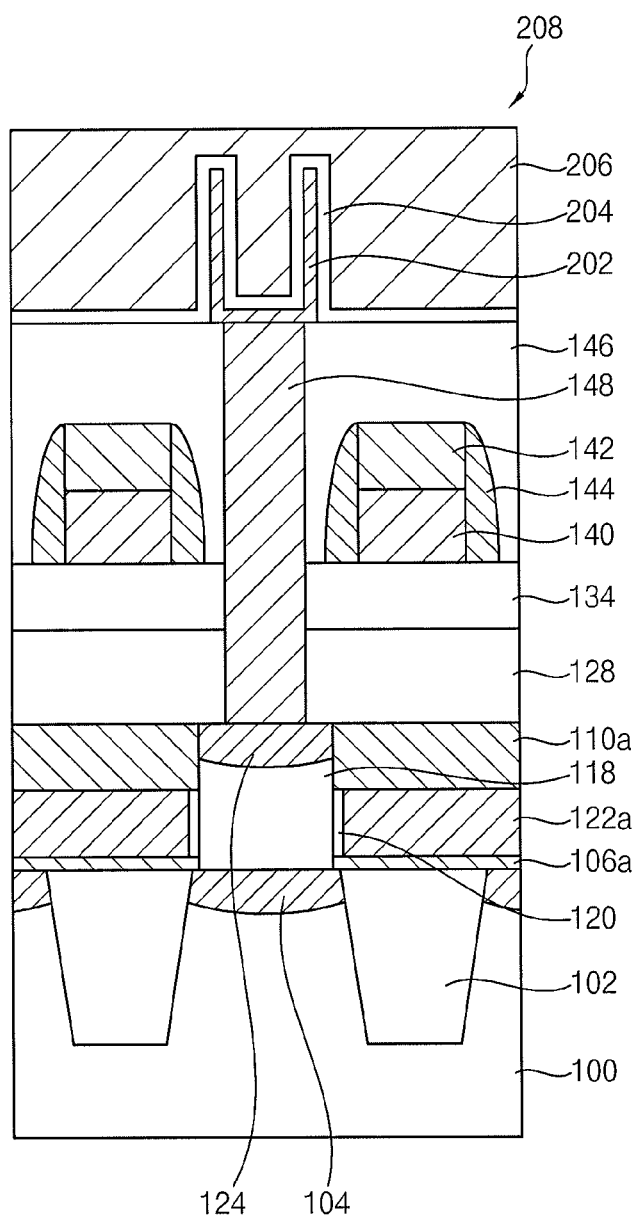
FIG. 28 is a cross-section view illustrating a DRAM device including a vertical-type pillar transistor in accordance with a second example embodiment.

FIG. 28 is a cross-section view illustrating a DRAM device including a vertical-type pillar transistor in accordance with a second example embodiment.

A vertical-type pillar transistor, a bit line and a contact plug of a DRAM device according to the present embodiment are substantially the same as in Embodiment 1. However, unlike the DRAM device in Embodiment 1, a capacitor 208 is provided on an upper surface of the contact plug in Embodiment 2.

The capacitor 208 includes a lower electrode 202, a dielectric layer 204 and an upper electrode 206. The lower electrode 202 and the upper electrode 206 may include metal. Alternatively, the lower electrode 202 and the upper electrode 206 may include polysilicon.

As illustrated in the figure, the lower electrode 202 may have a cylindrical shape. In this case, a contact area between the dielectric layer 204 and the lower electrode 202 may be increased to provide a higher capacitance.

Although it is not illustrated in the figure, the lower electrode 202 may have an isolated pattern shape having a flat upper surface. In this case, the dielectric layer 204 may make contact with only the upper surface of the lower electrode 202 to provide a relatively lower capacitance.

Hereinafter, a method of manufacturing the DRAM device in FIG. 28 will be described.

After performing the processes of forming the DRAM device in Embodiment 1, the capacitor may be formed to make contact with the contact plug to manufacture a DRAM device of the present embodiment.

In particular, the processes described with reference to FIGS. 3 to 17 are performed to form the structure in FIGS. 16 and 17. Then, processes for forming a cylindrical capacitor may be performed. Hereinafter, the processes for forming the cylindrical capacitor will be described.

An etch stop layer is formed to cover the third insulation interlayer 146 and the contact plug 148. The etch stop layer may be formed using silicon nitride by a chemical vapor deposition process.

A mold layer is formed on the etch stop layer. The mold layer may include a material having etch selectivity with respect to the etch stop layer. The mold layer may be formed using silicon oxide.

The mold layer may be partially etched by a photolithography and etch process, and then the etch stop layer may be etched to form openings that expose the upper surface of the contact plug. The opening may have a contact hole shape.

A lower electrode layer is conformally formed to follow the profile of the opening. The lower electrode layer may include polysilicon. Alternatively, the lower electrode layer may include metal. For example, the lower electrode layer may include titanium nitride, titanium, tantalum nitride, tantalum, etc.

A sacrificial layer is formed in the opening where the lower electrode layer is formed. The sacrificial layer may include the same material as the mold layer or organic material such as photoresist.

The sacrificial layer and the lower electrode layer are planarized to expose an upper surface of the mold layer. The lower electrode layer on the mold layer is removed by the planarization process to form a lower electrode 202 having a cylindrical shape.

The mold layer and the sacrificial layer are removed to expose surfaces of the lower electrode 202. The mold layer and the sacrificial layer may be removed by a wet etch process. When the sacrificial layer includes silicon oxide the same as the mold layer, the mold layer and the sacrificial layer may be removed using a LAL solution, a SC1 (standard clean 1) solution or a diluted hydrofluoric acid solution in the range of about 100:1 to about 400:1. The LAL solution is a mixed solution of ammonium fluoride and hydrofluoric acid, the SC1 solution is a mixed solution of ammonium hydroxide and hydrogen peroxide, and these mixed solutions are widely used as a cleaning solution in a semiconductor manufacture process.

A dielectric layer 204 and an upper electrode 206 are formed on the lower electrode 202.

Alternatively, although it is not in the figure, the capacitor may be a stacked structure of a lower electrode, a dielectric layer and an upper electrode having a flat upper surface respectively. A lower electrode layer, a dielectric layer and an upper electrode layer may be stacked on one another, and sequentially patterned to form the stack type capacitor.

Embodiment 3

Figure 29:
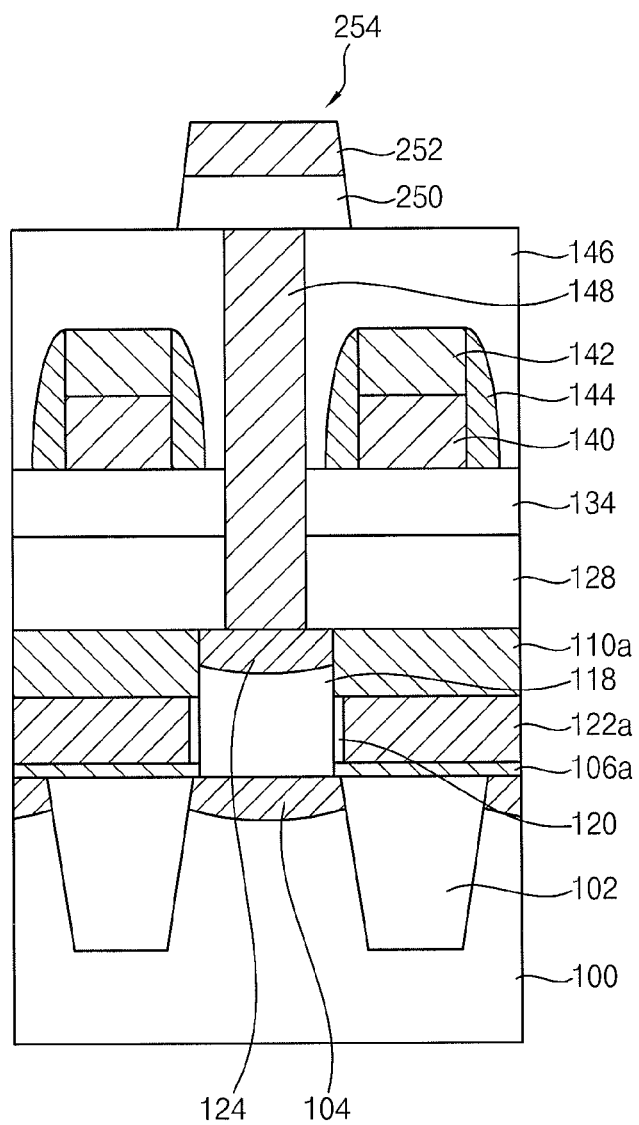
FIG. 29 is a cross-section view illustrating a memory device including a vertical-type pillar transistor in accordance with a third example embodiment.

FIG. 29 is a cross-section view illustrating a memory device including a vertical-type pillar transistor in accordance with a third example embodiment.

A vertical-type pillar transistor, a bit line and a contact plug of a memory device according to the present embodiment are substantially the same as in Embodiment 1. However, unlike the DRAM device in Embodiment 1, a phase changeable structure 254 is provided on an upper surface of the contact plug.

The phase changeable structure 254 has a staked structure of a phase changeable layer pattern 250 and an upper electrode 252. For example, the upper electrode 252 may include metal. For example, the upper electrode 252 may include tungsten, titanium, titanium nitride, tantalum, tantalum nitride, molybdenum nitride, niobium nitride, titanium silicon nitride, aluminum, titanium aluminum nitride, titanium boron nitride, zirconium aluminum nitride, molybdenum silicon nitride, tungsten boron nitride, zirconium aluminum nitride, molybdenum silicon nitride, molybdenum aluminum nitride, tantalum silicon nitride, tantalum aluminum nitride. These may be used alone or in a combination thereof.

The phase changeable layer pattern 250 may include a chalcogenide. For example, the phase changeable layer pattern 250 may include germanium, antimony and tellurium. In this case, the contact plug may be provided as a lower electrode.

A mask pattern (not illustrated) is provided on the upper electrode 252.

When a specific current is applied to the phase changeable layer pattern 250 by a voltage difference between the upper electrode 252 and the contact plug 148 provided as the lower electrode, a phase of the phase changeable layer pattern is changed from a single-crystalline phase having a relatively low resistance to an amorphous phase having a relatively high resistance. Additionally, when the current applied to the phase changeable layer pattern 250 is decreased or removed, the phase of the phase changeable layer pattern 250 is changed from an amorphous phase to a single-crystalline phase. Thus, as the phase of the phase changeable layer pattern 250 is changed, the phase changeable structure including the lower electrode, the phase changeable layer pattern 250 and the upper electrode 250 may function as a switch.

After performing the processes of forming the DRAM device in Embodiment 1, the phase changeable structure may be formed to make contact with the contact plug to manufacture a memory device in FIG. 29.

In particular, the processes described with reference to FIGS. 3 to 17 are performed to form the structure in FIGS. 16 and 17. Then, processes for forming a phase changeable structure may be performed. Hereinafter, the processes for forming the phase changeable structure will be described.

A phase changeable layer is formed to cover the third insulation interlayer 146 and the contact plug 148. The phase changeable layer may include a chalcogenide. The chalcogenide may include germanium (Ge), antimony (Sb) and tellurium (Te).

An upper electrode layer is formed on the phase changeable layer. The upper electrode layer may include metal. For example, the upper electrode layer may include tungsten, titanium, titanium nitride, tantalum, tantalum nitride, molybdenum nitride, niobium nitride, titanium silicon nitride, aluminum, titanium aluminum nitride, titanium boron nitride, zirconium aluminum nitride, molybdenum silicon nitride, tungsten boron nitride, zirconium aluminum nitride, molybdenum silicon nitride, molybdenum aluminum nitride, tantalum silicon nitride, tantalum aluminum nitride. These may be used alone or in a combination thereof.

A mask pattern is formed on the upper electrode layer. The mask pattern may include silicon nitride or silicon oxide.

The upper electrode layer and the phase changeable layer are etched using the mask pattern to form the phase changeable layer pattern 250 and the upper electrode 252 having an isolated shape to be connected to the contact plug 148.

Although it is not illustrated in the figures, a magnetic structure may be provided on an upper surface of the contact plug in Embodiment 1 to manufacture a memory device in accordance with another example embodiment. The magnetic structure may include a magnetoresistive tunnel junction (MJT) structure. The magnetic structure may include a tunnel junction of a first ferromagnetic layer, a tunneling barrier layer and a second ferromagnetic layer. Accordingly, data may be stored in the magnetic structure.

Figure 30:
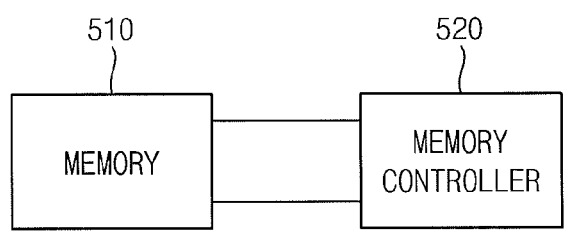
FIGS. 30 to 33 illustrate further embodiments of the present invention.

FIG. 30 illustrates another embodiment.

As illustrated in FIG. 30, this embodiment includes a memory 510 connected to a memory controller 520. The memory 510 may be the DRAM device described above. However, the memory 510 may be any memory architecture having the structures according to embodiments of the present invention. The memory controller 520 supplies the input signals for controlling operation of the memory 510. For example, the memory controller 520 supplies the command CMD and address signals, I/O signals, etc. It will be appreciated that the memory controller 520 may control the memory 510 based on received signals.

Figure 31:
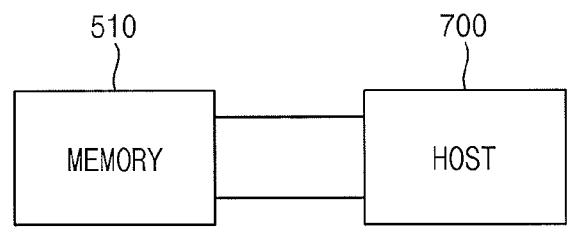

FIG. 31 illustrates yet another embodiment.

The memory 510 may be connected with a host system 700. The memory 510 may be any memory architecture having the structures according to embodiments of the present invention. The host system 700 may include an electric product such as a personal computer, digital camera, mobile application, game machine, communication equipment, etc. The host system 700 supplies the input signals for controlling operation of the memory 510. The memory 510 is used as a date storage medium.

Figure 32:
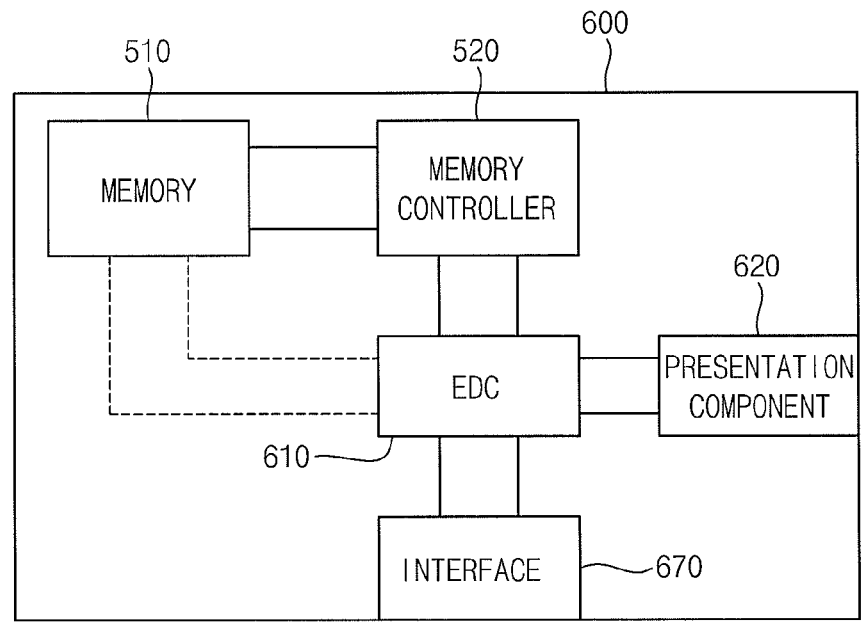

FIG. 32 illustrates a further embodiment. This embodiment represents a portable device 600. The portable device 600 may be an MP3 player, video player, combination video and audio player, etc. As illustrated, the portable device 600 includes the memory 510 and memory controller 520. The memory 510 may be any memory architecture having the structures according to embodiments of the present invention. The portable device 600 may also includes an encoder and decoder (EDC) 610, a presentation component 620 and an interface 630. Data (video, audio, etc.) is input to and output from the memory 510 via the memory controller 520 by the EDC 610.

Figure 33:
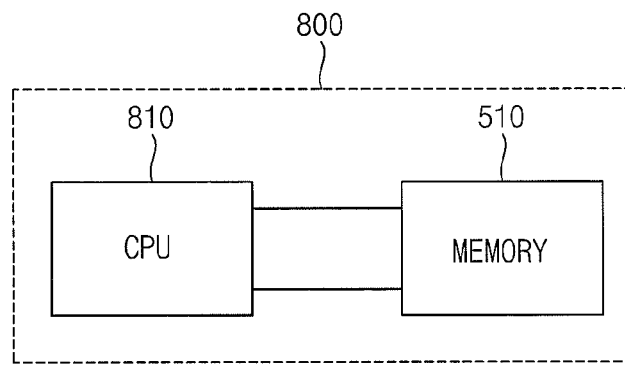

FIG. 33 illustrates a still further embodiment of the present invention. As illustrated, the memory 510 may be connected to a central processing unit (CPU) 810 within a computer system 800. For example, the computer system 800 may be a personal computer, personal data assistant, etc. The memory 510 may be directly connected with the CPU 810, connected via bus, etc. The memory 510 may be any memory architecture having the structures according to embodiments of the present invention. It will be appreciated, that FIG. 33 does not illustrate the full complement of components that may be included within a computer system 800 for the sake of clarity.

As described above, a vertical-type transistor in accordance with some example embodiments may be used as a selection transistor for various memory devices. Further, a vertical-type transistor in accordance with some example embodiments may function as a memory cell where an electrical charge is injected into or removed from the channel region thereof to store data.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
a semiconductor pattern provided on a substrate;
a gate adjacent to a sidewall of the semiconductor pattern, the gate having an upper surface lower than an upper surface of the semiconductor pattern;
a mask pattern formed on the upper surface of the gate, the mask pattern having an upper surface coplanar with the upper surface of the semiconductor pattern;
a first impurity region in the substrate under the semiconductor pattern; and
a second impurity region under the upper surface of the semiconductor pattern.

2. The semiconductor device of claim 1, further comprising an insulation layer pattern is provided on the substrate and a lower surface of the gate.

3. The semiconductor device of claim 1, wherein the mask pattern includes insulating material.

4. The semiconductor device of claim 1, wherein the gate comprises a gate insulation layer and gate electrode.

5. The semiconductor device of claim 4, wherein the gate insulation layer is provided on the sidewall of the gate electrode.

6. The semiconductor device of claim 1, wherein the semiconductor pattern includes the single-crystalline semiconductor.

7. The semiconductor device of claim 1, further comprising a spacer provided on sidewalls of the gate and the mask pattern.

8. The semiconductor device of claim 1, comprising a contact plug electrically connected to the second impurity region; and
a wiring line provided on the contact plug.

9. The semiconductor device of claim 1, wherein the gate has a liner shape.

10. A semiconductor device, comprising:
a substrate included an active region;
a semiconductor pattern provided on the substrate of the active region;
a gate adjacent to a sidewall of the semiconductor pattern, the gate having an upper surface lower than an upper surface of the semiconductor pattern, the gate having a linear shape;
a mask pattern formed on the upper surface of the gate, the mask pattern having an upper surface coplanar with the upper surface of the semiconductor pattern;
a first impurity region in the substrate;
a second impurity region under the upper surface of the semiconductor pattern; and
a contact plug electrically connected to the second impurity region.

11. The semiconductor device of claim 10, further comprising an insulation layer pattern is provided on the substrate and a lower surface of the gate.

12. The semiconductor device of claim 10, wherein the mask pattern includes insulating material.

13. The semiconductor device of claim 10, wherein the gate comprises a gate insulation layer and gate electrode on a surface of the gate insulation layer.

14. The semiconductor device of claim 10, wherein the semiconductor pattern includes the single-crystalline semiconductor.

15. The semiconductor device of claim 10, further comprising a spacer provided on sidewalls of the gate and the mask pattern.

16. The semiconductor device of claim 10, further comprising a wiring line provided on the contact plug.

* * * * *